United States Patent [19]
Douglas et al.

[11] Patent Number: 5,520,992
[45] Date of Patent: May 28, 1996

[54] ELECTRODES FOR HIGH DIELECTRIC CONSTANT MATERIALS

[75] Inventors: Monte A. Douglas, Coppell; Scott R. Summerfelt, Dallas, both of Tex.

[73] Assignee: Texas Instruments Incorporated, Dallas, Tex.

[21] Appl. No.: 81,484

[22] Filed: Jun. 22, 1993

Related U.S. Application Data

[63] Continuation of Ser. No. 871,864, Apr. 20, 1992, abandoned.

[51] Int. Cl.$^6$ ................................................. C23C 14/06
[52] U.S. Cl. .......................... 428/209; 428/697; 428/698; 428/699; 428/701
[58] Field of Search ..................................... 428/697, 701, 428/698, 699, 209; 361/313

[56] References Cited

U.S. PATENT DOCUMENTS

| | | | |
|---|---|---|---|
| 4,184,192 | 1/1980 | Yoshido et al. | 252/514 |
| 4,186,423 | 1/1980 | Yoshido et al. | 252/514 |
| 4,387,387 | 6/1983 | Yamazaki | 357/30 |
| 4,528,546 | 7/1985 | Paoli | 338/195 |
| 4,598,306 | 7/1986 | Nath et al. | 357/30 |
| 4,959,745 | 9/1990 | Suguro | 361/311 |
| 4,982,309 | 1/1991 | Shepherd | 361/321 |
| 5,003,428 | 3/1991 | Shepherd | 361/321 |
| 5,005,102 | 4/1991 | Larson | 361/313 |
| 5,031,144 | 7/1991 | Persky | 365/145 |
| 5,046,043 | 9/1991 | Miller et al. | 365/145 |
| 5,053,917 | 10/1991 | Miyasaka et al. | 361/321 |
| 5,070,026 | 12/1991 | Greenwald et al. | 437/3 |
| 5,085,926 | 2/1992 | Iida et al. | 428/698 |
| 5,164,808 | 11/1992 | Evans, Jr. et al. | 361/305 |

OTHER PUBLICATIONS

Kazuya, et al., "Semiconductor Device", *Patent Abstracts of Japan*, vol. 17, No. 213, 26 Apr. 1993.

Tsutomu, et al., "Capacitor", *Patent Abstracts of Japan*, vol. 9, No. 211, 29 Aug. 1985.

S. Zaima, T. Furuta, and Y. Yasuda, "Preparation and Properties of Ta2O$_5$ Films by LPCVD for ULSI Application," J. Electrochem. Soc., vol. 137, No. 4.

S. Zaima, T. Furuta, Y. Koide and Y. Yasuda, "Conduction Mechanism of Leakage Current in Ta$_2$O$_5$ Films on Si Prepared by LPCVD," J. Electrochem Soc., vol. 137, No. 9, pp. 2876–2879, Sep. 1990.

Q. X. Jia, Z. Q. Shi, K. L. Jiao and W. A. Anderson, "Reactively Sputtered RuO$_2$ Thin Film Resistor with Near Zero Temperature Coefficient of Resistance," Thin Solid Films, 196 (1991) 29–34 Electronics and Optics.

Y. Nishioka, H. Shinriki, and K. Mukai, "Influence of SiO$_2$ at the Ta$_2$O$_5$/Si Interface of Dielectric Characteristics of Ta$_2$O$_5$ Capacitors," J. Appl Phys. 61(6), pp. 2335–2338, 15 Mar. 1987.

Y. Nishioka, H. Shinriki, and K. Mukai, "Time Dependent, Dielectric Breakdown Characteristics of Ta$_2$O$_5$/SiO$_2$ Double Layers," J. Electrochem Soc., vol. 136, No. 3, Mar. 1989, pp. 872–873.

R. W. Vest, "Materials Science of Thick Film Technology," Ceramic Bulletin vol. 65 #4 1986 pp. 631–636.

*Primary Examiner*—A. A. Turner
*Attorney, Agent, or Firm*—James E. Harris; Richard A. Stoltz; Richard L. Donaldson

[57] ABSTRACT

Novel methods of forming capacitors containing high dielectric materials are disclosed. Capacitors are made by forming a layer of conductive metal nitride (e.g. ruthenium nitride, 28), then forming a layer of a high dielectric constant material (e.g. barium strontium titanate, 30) on the metal nitride layer, then forming a layer of a non-metal containing electrically conductive compound (e.g. ruthenium oxide, 32) on the layer of high dielectric constant material. Typically, the high dielectric constant material is a transition metal oxide, a titanate, a titanate doped with one or more rare earth elements, a titanate doped with one or more alkaline earth metals, or combinations thereof. Preferably, the conductive compound is ruthenium nitride, ruthenium dioxide, tin nitride, tin oxide, titanium nitride, titanium monoxide, or combinations thereof. The conductive compound may be doped to increase its electrical conductivity.

13 Claims, 1 Drawing Sheet

5,520,992

ELECTRODES FOR HIGH DIELECTRIC CONSTANT MATERIALS

This application is a continuation of application Ser. No. 07/871,864, filed Apr. 20, 1992, now abandoned.

FIELD OF THE INVENTION

This invention generally relates to providing electrical connections to materials with high dielectric constants, such as in the construction of capacitors.

BACKGROUND OF THE INVENTION

Without limiting the scope of the invention, its background is described in connection with current methods of forming electrical connections to high dielectric constant materials, as an example.

High dielectric constant (hereafter abbreviated HDC) materials exhibit high dielectric constants (generally greater than 20) which make them useful for the fabrication of many electrical devices, such as capacitors. Examples of these HDC materials include titanates such as barium strontium titanate and lead zirconium titanate, titanates doped with one or more acceptors such as alkaline earth metals (i.e. group IIA elements), and titanates doped with one or more donors such as rare earth elements (i.e. the lanthanide series elements plus yttrium). Many ferroelectrics and transition metal oxides (i.e. oxides of elements with atomic number 21–29, 39–47, 57–79, and 89 and above) also exhibit high dielectric constants. To be useful in electronic devices, however, reliable electrical connections must be constructed which do not diminish the beneficial properties of these HDC materials.

Heretofore, in this field, single and multiple metal layers are generally used to form electrical contacts to HDC materials. For example, to provide an electrical connection to an HDC material which makes up a capacitor on the surface of a semiconductor substrate, the following techniques are among those now employed: (a) dielectric/platinum/substrate, (b) dielectric/platinum/tantalum/substrate, (c) dielectric/gold/substrate, (d) dielectric/gold palladium/substrate, (e) dielectric/gold palladium/tungsten/substrate. The layering sequence in these examples is from the top down to the substrate (e.g. silicon). A similar metallization scheme is required for the top of the dielectric film to complete the capacitor structure. In general, current approaches use a noble metal to contact the dielectric in conjunction with another metal to serve as a sticking layer.

SUMMARY OF THE INVENTION

A technique to form an electrical connection to a dielectric material should generally do so with low resistivity while preserving the bulk dielectric constant of the material by avoiding series stray capacitances at the dielectric interface, preventing contamination of the substrate material by constituents of the dielectric material, preventing contamination of the dielectric material by the connecting material, and preventing delamination of the connecting material. In addition, the number of deposited layers should generally be minimized to simplify the fabrication process.

It has been discovered that current methods of providing electrical connection to HDC materials can produce undesirable results, including reduction of the effective dielectric constant by series stray capacitance formed by an interfacial oxide between the contacting metal and the dielectric, oxidation of the sticking layer which results in large contact resistance, contamination of the silicon-based components (for example) by the elements comprising the dielectric material, contamination of the dielectric by the contacting metal layer, delamination of the contacting metal layer, and difficulty in the manufacturing process due to the requirement for multiple layers (noble metal contacting layer and additional metal sticking layer).

The structure which is the subject of this invention is a dielectric material (e.g. a ferroelectric) and at least one electrical connection made to the dielectric. The connecting materials are electrically conductive, non-metal containing compounds (non-metal containing compounds are compounds with at least one constituent that is not a metal). Examples of such compounds are ruthenium nitride, ruthenium dioxide, tin nitride, tin oxide, titanium nitride, and titanium monoxide. Compounds which are doped to increase their electrical conductivity may also be used as electrical connections. An example of the novel structures presented is a capacitor made of a layer of barium strontium titanate between two layers of ruthenium nitride.

These are apparently the first structures wherein electrically conductive metal compounds provide electrical connection to high dielectric materials. The disclosed structures generally accomplish all of the goals of providing an electrical connection to a HDC material without the disadvantages of the current structures. Because it is a reacted metal, the connection layer is more inert toward diffusion and contamination of the dielectric or surrounding materials. The reacted metal compound can also serve as a diffusion barrier between the HDC material and the surrounding materials (and vice versa), preventing contamination. By being a reacted metal, further reaction is minimized which inhibits delamination. The connection is a single layer so that it can be more easily and economically processed in a manufacturing environment.

Because many of the HDC materials are formed or deposited in an oxidizing ambient, the material or materials which comprise the electrical connections are chosen such that their oxides are electrically conductive. This eliminates the series stray capacitance caused by non-conductive interfacial oxides which can be a result of current approaches.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings.

In the drawings.

DETAILED DESCRIPTION OF THE PREFERRED EMBODIMENTS

Figure 1:
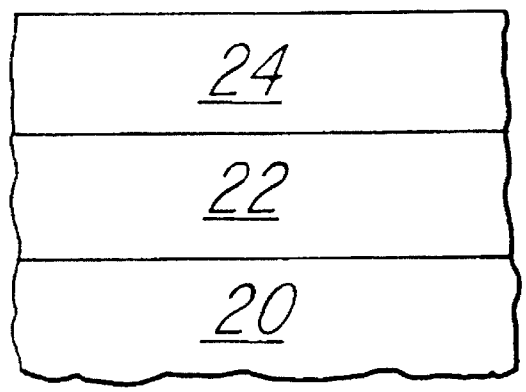
FIG. 1 is a cross-section of a capacitor.

A preferred embodiment for this invention, with reference to FIG. 1, is a capacitor comprising three layers: a first connecting layer 20 made of ruthenium nitride, a dielectric layer 22 made of barium strontium titanate, and a second connecting layer 24 also made of ruthenium nitride.

Figure 2:
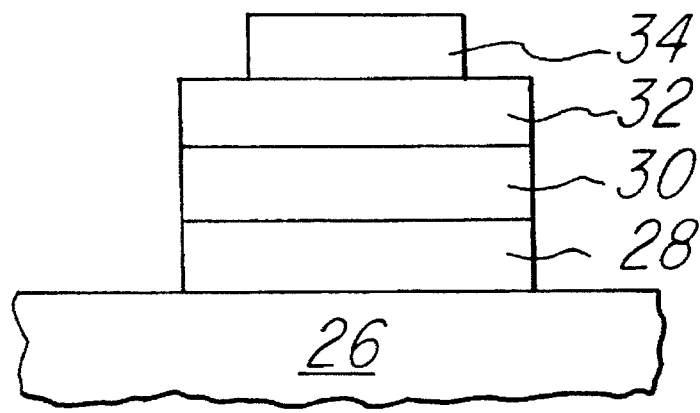
FIG. 2 is a microscopic cross-section of a capacitor formed on the surface of a semiconductor substrate.

In an alternate embodiment, with reference to FIG. 2, such a capacitor structure may be formed on the surface of a semiconductor body 26. A layer of ruthenium nitride 28 is deposited on a portion of the surface of a semiconductor, then a dielectric layer of barium strontium titanate 30 is deposited, then a second connecting layer 32 of ruthenium nitride. Electrical connection to other devices on or within the semiconductor may be provided with a metal contact 34, typically made of aluminum. Although FIG. 2 illustrates a planar geometry for all of the elements of the capacitor, this invention applies equally well to the construction of capacitor structures of more complicated geometries, including capacitors built into depressions in the semiconductor surface.

Figure 3:
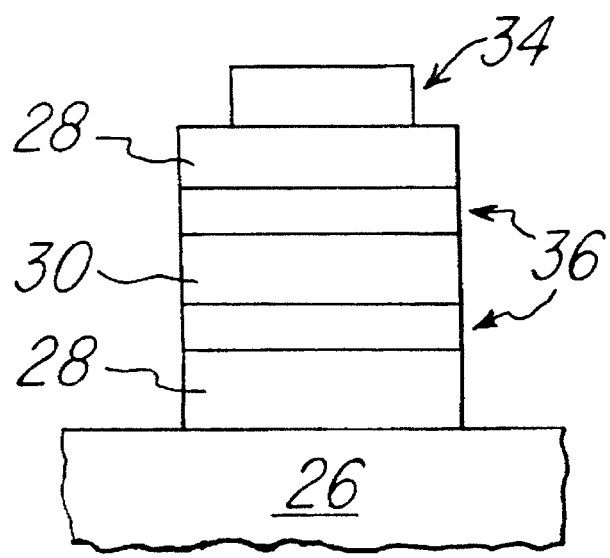
FIG. 3 is a microscopic cross-section of a capacitor formed on the surface of a semiconductor substrate.

In yet another alternate embodiment, with reference to FIG. 3, such a capacitor structure may be formed using two compounds to provide the electrical contact to the HDC material 30: (a) conductive metal nitrides 28 and (b) their respective conductive metal oxides 36. The metal nitride layer 28 serves as a diffusion barrier, and the metal oxide layer 36 serves as a stable, conductive contact with the HDC 30. There are at least two ways of forming these dual layers. The first involves deposition of metal nitride followed by deposition of a metal oxide to be in contact with the HDC. Another method simply involves deposition of a metal nitride layer which will partially convert to a conductive metal oxide upon deposition of the HDC material. Examples of metals that form conductive nitrides and oxides include ruthenium (ruthenium nitride/ruthenium oxide) and tin (tin nitride/tin oxide).

Alternate materials for the capacitor dielectric 22 and 30 include titanates such as lead zirconium titanate, titanates doped with one or more rare earth elements, titanates doped with one or more alkaline earth metals, transition metal oxides such as tantalum pentoxide and niobium pentoxide, and ferroelectric materials.

Alternate materials for the electrical connecting layers 20, 24, 28, and 32 include tin nitride and tin oxide, titanium nitride and titanium monoxide, tin nitride and tin oxide. These compounds may also be doped in order to increase their electrical conductivity, such as indium doped tin nitride, aluminum doped zinc nitride, indium doped tin oxide, and aluminum doped zinc oxide.

Many alternate semiconductor substrates are possible, including compound semiconductors such as gallium arsenide and indium phosphide. Capacitors fabricated on compound semiconductors may benefit most from these novel structures because compound semiconductors are often particularly sensitive to contamination, which is generally prevented by these novel structures.

The sole Table, below, provides an overview of some embodiments and the drawings.

TABLE

| Drawing Element | Generic Term | Preferred or Specific Terms | Alternate Terms |
| --- | --- | --- | --- |
| 20<br>24<br>28<br>32<br>36 | Conductive metal compound | Ruthenium Nitride | Metal Nitrides:<br>ruthenium nitride, tin nitride, titanium nitride<br>Metal oxides:<br>ruthenium dioxide ($RuO_2$), tin oxide, titanium monoxide (TiO)<br>Doped metal nitrides:<br>Indium doped tin nitride |

TABLE-continued

| Drawing Element | Generic Term | Preferred or Specific Terms | Alternate Terms |
| --- | --- | --- | --- |
| 22<br>30 | Dielectric | Barium Strontium Titanate | Aluminum doped zinc nitride<br>Doped metal oxides:<br>Indium doped tin oxide, Aluminum doped zinc oxide<br>Ferroelectrics:<br>Lead zirconium titanate<br>Lanthanum doped lead zirconium titanate<br>$PbTiO_3$, $KNbO_3$, $KTaO_3$, $(Pb, Mg)NbO_3$, $Bi_4Ti_3O_{12}$<br>Transition metal oxides:<br>tantalum pentoxide, niobium pentoxide, $TiO_2$.<br>High Dielectric Constant Oxides:<br>$Ta_2O_5$, $Y_2O_3$, $SrTiO_3$, $TiO_3$<br>Donor doped Perovskites:<br>La or Nb doped $(Ba, Sr, Pb)(Ti, Zr)O_3$<br>Charge storage materials |
| 26 | Semiconductor Substrate | Silicon | Semiconductors:<br>Germanium, etc.<br>Compound Semiconductors:<br>GaAs, InP, AlGaAs, etc. |
| 34 | Electrical Contact | Aluminum | Metals<br>Silicides |

A few preferred embodiments have been described in detail hereinabove. It is to be understood that the scope of the invention also comprehends embodiments different from those described, yet within the scope of the claims. With reference to the structures described, electrical connections to such structures can be ohmic, rectifying, capacitive, direct or indirect, via intervening circuits or otherwise. Implementation is contemplated in discrete components or fully integrated circuits in silicon, germanium, gallium arsenide, or other electronic materials families.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A structure comprising:

a semiconductor structure;

a first layer formed on said semiconductor substrate and comprising a conductive nitride of a first metal;

a second layer in contact with said first layer and comprising a conductive oxide of said first metal;

a third layer in contact with said second layer and comprising a dielectric material; and an electrical connection formed on said third layer.

2. The structure of claim 1, wherein said first metal is selected from the group consisting of ruthenium, tin, zinc and titanium.

3. The structure of claim 1, wherein said first layer is in contact with said semiconductor substrate.

4. The structure of claim 1, wherein said dielectric material is selected from the group consisting of barium strontium titanate, lead zirconate titanate, lead titanate, potassium niobate, potassium tantalate, lead niobate, lead magnesium niobate, magnesium niobate, bismuth titanate, tantalum pentoxide, niobium pentoxide, titanium dioxide, yttrium trioxide, strontium titanate, titanium trioxide, lanthanum-doped $(Ba,Sr,Pb)(Ti,Zr)O_3$, and niobium-doped $(Ba,Sr,Pb)(Ti,Zr)O_3$.

5. The structure of claim 1, wherein said conductive oxide is doped to form a doped metal oxide whereby the electrical conductivity of said doped metal oxide is greater than the electrical conductivity of said conductive oxide.

6. The structure of claim 5, wherein said doped metal oxide is indium doped tin oxide.

7. The structure of claim 1, wherein said conductive nitride is doped to form a doped metal nitride whereby the electrical conductivity of said doped metal nitride is greater than the electrical conductivity of said conductive nitride.

8. The structure of claim 7, wherein said doped metal nitride is indium doped tin nitride or aluminum doped zinc nitride.

9. The structure of claim 1, wherein said electrical connection comprises:

a fourth layer in contact with said third layer and comprising a conductive oxide of a second metal; and a fifth layer in contact with said fourth layer and comprising a conductive nitride of said second metal.

10. The structure of claim 9, wherein said first metal and said second metal are the same metal.

11. The structure of claim 9, wherein said first metal and said second metal are selected from the group consisting of ruthenium, tin, zinc and titanium.

12. The structure of claim 9, wherein said first layer is in contact with said semiconductor substrate.

13. The structure of claim 9, wherein said dielectric material is selected from the group consisting of barium strontium titanate, lead zirconate titanate, lead titanate, potassium niobate, potassium tantalate, lead niobate, lead magnesium niobate, magnesium niobate, bismuth titanate, tantalum pentoxide, niobium pentoxide, titanium dioxide, yttrium trioxide, strontium titanate, titanium trioxide, lanthanum-doped $(Ba,Sr,Pb)(Ti,Zr)O_3$, and niobium-doped $(Ba,Sr,Pb)(Ti,Zr)O_3$.

\* \* \* \* \*